United States Patent
Scholer et al.

(10) Patent No.: US 6,433,371 B1
(45) Date of Patent: Aug. 13, 2002

(54) CONTROLLED GATE LENGTH AND GATE PROFILE SEMICONDUCTOR DEVICE

(75) Inventors: Thomas C. Scholer, San Jose; Allen S. Yu, Fremont; Paul J. Steffan, Elk Grove, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/493,428

(22) Filed: Jan. 29, 2000

(51) Int. Cl.[7] .................... H01L 29/76; H01L 29/94; H01L 31/062
(52) U.S. Cl. ................ 257/288; 257/331; 257/336; 257/412
(58) Field of Search .................. 257/344, 336, 257/331, 408, 334, 412, 413, 288, 102, 283; 438/587, 585, 279

(56) References Cited

U.S. PATENT DOCUMENTS

| | | | |
|---|---|---|---|
| 4,558,338 A | * 12/1985 | Sakata ..................... 29/4 |
| 4,642,259 A | * 2/1987 | Vatanen et al. ........... 428/137 |
| 4,656,076 A | * 4/1987 | Vetanen et al. ........... 428/137 |
| 5,175,118 A | 12/1992 | Voneda .................... 437/40 |
| 5,472,897 A | * 12/1995 | Hsu et al. ................. 437/44 |
| 5,571,738 A | * 11/1996 | Krivopaic ................. 437/44 |
| 5,734,185 A | 3/1998 | Iguchi et al. ............. 257/336 |
| 5,736,435 A | * 4/1998 | Venkatesan et al. ....... 438/151 |
| 5,750,430 A | * 5/1998 | Son .......................... 438/303 |
| 5,854,509 A | * 12/1998 | Kunikiyo .................. 57/506 |
| 5,877,056 A | * 3/1999 | Wu ........................... 438/291 |
| 5,879,998 A | * 3/1999 | Krivokapic ............... 438/300 |
| 5,998,847 A | * 12/1999 | Assaderaghi et al. ..... 257/401 |
| 6,018,179 A | * 1/2000 | Gardner et al. ........... 257/336 |
| 6,087,208 A | * 7/2000 | Krivopaic et al. ........ 438/183 |
| 6,133,606 A | * 10/2000 | Tung ........................ 257/332 |
| 6,146,955 A | * 11/2000 | Lee .......................... 438/305 |
| 6,169,315 B1 | * 1/2001 | Son .......................... 257/408 |
| 6,184,116 B1 | * 2/2001 | Shen et al. ............... 438/587 |

\* cited by examiner

Primary Examiner—Jerome Jackson, Jr.
Assistant Examiner—Shrinivas H. Rao
(74) Attorney, Agent, or Firm—Mikio Ishimaru

(57) ABSTRACT

Ultra-large scale CMOS integrated circuit semiconductor devices are provided which have width- and profile-controlled, inverted trapezoidal gates with LDD structures having gradual doping profiles and salicided for contacts. The structures are manufactured on a substrate by forming a barrier layer over the substrate, forming a gate layer over the barrier layer, forming inverted trapezoidal gate trenches into the gate layer, depositing a gate dielectric in the inverted trapezoidal gate trenches on the substrate, forming polysilicon gates in the inverted trapezoidal gate trenches, removing the gate layer and the barrier layer to define gate spacers, implanting the substrate around the gate spacers with a dopant to form source/drain extension junctions, and preparing the source/drain extension junctions and the gates for conductive connections.

6 Claims, 4 Drawing Sheets

CONTROLLED GATE LENGTH AND GATE PROFILE SEMICONDUCTOR DEVICE

CROSS REFERENCE TO RELATED APPLICATION(S)

The present application contains subject matter related to a concurrently filed U.S. patent application Ser. No. 09/493,437 by Allen S. Yu, Paul J. Steffan, and Thomas Scholer entitled "SEMICONDUCTOR DEVICE WITH REDUCED GATE LENGTH AND MANUFACTURING METHOD THEREFOR". The related application is assigned to Advanced Micro Devices, Inc.

The present application also contains subject matter related to a concurrently filed U.S. patent application Ser. No. 09/493,438 by Allen S. Yu, Paul J. Steffan, and Thomas Scholer entitled "SEMICONDUCTOR DEVICE WITH REDUCED GATE LENGTH AND MANUFACTURING METHOD THEREFOR". The related application is assigned to Advanced Micro Devices, Inc.

TECHNICAL FIELD

The present invention relates generally to manufacturing semiconductors and more specifically to a manufacturing method for Metal-Oxide-Semiconductors (MOS) which employ lightly doped drain (LDD) structures.

BACKGROUND ART

Complementary Metal-Oxide-Semiconductor (CMOS) is the primary technology for ultra large-scale integrated (ULSI) circuits. These ULSI circuits combine two types of Metal-Oxide-Semiconductor (MOS) devices, namely P-channel Metal-Oxide-Semiconductor (PMOS) devices and N-channel Metal-Oxide-Semiconductor (NMOS) devices, on the same integrated circuit. To gain performance advantages, scaling down the size of MOS devices has been the principal focus of the microelectronics industry over the last two decades.

The conventional process of manufacturing MOS devices involves doping a semiconductor substrate and forming a gate oxide layer on the substrate followed by a deposition of polysilicon. A photolithographic process is used to etch the polysilicon to form the device gate. As device sizes are scaled down, the gate width, source/drain (S/D) junctions have to scale down. As the gate width reduces, the channel length between the source and drain is shortened. The shortening in channel length has led to several severe problems.

One of the problems associated with shortened channel length is the so-called "hot carrier effect". As the channel length is shortened, the maximum electric field $E_m$ becomes more isolated near the drain side of the channel causing a saturated condition that increases the maximum energy on the drain side of the MOS device. The high energy causes electrons in the channel to become "hot". The electron generally becomes hot in the vicinity of the drain edge of the channel where the energy arises. Hot electrons can degrade device performance and cause breakdown of the device. Moreover, the hot electrons can overcome the potential energy barrier between the semiconductor substrate and the silicon dioxide layer overlying the substrate, which causes hot electrons to be injected into the gate oxide layer.

Problems arising from hot carrier injections into the gate oxide layer include generation of a gate current and generation of a positive trapped charge which can permanently increase the threshold voltage of the MOS device. These problems are manifested as an undesirable decrease in saturation current, decrease of the transconductance and a continual reduction in device performance caused by trapped charge accumulation. Thus, hot carrier effects cause unacceptable performance degradation in MOS devices built with conventional drain structures when channel lengths are short.

Reducing the maximum electric field, $E_m$, in the drain side of the channel is a popular way to control the hot carrier injections. A common approach to reducing $E_m$ is to minimize the abruptness in voltage changes near the drain side of the channel. Disbursing abrupt voltage changes reduces $E_m$ strength and the harmful hot carrier effects resulting therefrom. Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the channel. The smoother or more gradual the doping profile, the smaller $E_m$ is which results in lesser hot carrier injections.

To try to remedy the problems associated with hot carrier injections, alternative drain structures such as lightly doped drain (LDD) structures have been developed. LDD structures provide a doping gradient at the drain side of the channel that lead to the reduction in $E_m$. The LDD structures act as parasitic resistors to absorb some of the energy into the drain and thus reduce maximum energy in the channel. This reduction in energy reduces the formation of hot electrons. To further minimize the formation of hot electrons, an improvement in the gradual doping profile is needed.

In most typical LDD structures of MOS devices, S/D junctions are formed by two implants with dopants. One implant is self-aligned to the polysilicon gate to form shallow S/D extension junctions. An oxide or oxynitride implant spacer then is formed around the polysilicon gate. With the shallow S/D extension junctions protected by the implant spacer, a second implant with a heavier dose is self-aligned to the implant spacer to form deep S/D junctions. There would then be a rapid thermal anneal (RTA) of the S/D junctions to enhance the diffusion of the dopants so as to optimize the device performance. The purpose of the first implant is to form an LDD at the edge of the polysilicon gate near the channel. In an LDD structure, almost the entire voltage drop occurs across the lightly doped drain region. The second implant with heavier dose forms low resistance deep S/D junctions, which are coupled to the LDD structures. Since the second implant is spaced from the channel by the implant spacer, the resulting drain junction adjacent to the light doped drain region can be made deeper without impacting device operation. The increase junction depth lowers the sheet resistance and the contact resistance of the drain.

In most typical LDD structures for CMOS devices, S/D junctions are formed by four implants with dopants, each implant requiring a masking step. The four masking steps are: a first mask (a P-LDD mask) to form the P-LDD structures, a second mask (an N-LDD mask) to form the N-LDD structures, a third mask (a P+S/D mask) to form the P-type doped, deep S/D junctions, and a fourth mask (an N+S/D mask) to form the N-type doped, deep S/D junctions. Each masking step typically includes the sequential steps of preparing the semiconductor substrate, applying a photoresist material, soft-baking, patterning and etching the photoresist to form the respective mask, hard-baking, implanting a desired dose of a dopant with the required conductivity type, stripping the photoresist, and then cleaning of the substrate. These processing steps associated with each masking step adversely increase cycle time and process complexity and also introduce particles and defects, resulting in an undesirable increase in cost and yield loss. Hence, there is a need to provide a method for forming MOS devices and CMOS devices with LDD structures that lessens the number of masking steps required.

Further improvements in transistor reliability and performances for exceeding smaller devices are achieved by a transistor having LDD structures only at the drain region (asymmetric LDD structures). Parasitic resistance due to the LDD structure at the source region of a transistor causes a decrease in drain current as well as greater power dissipation for a constant supply voltage. The reduction in drain current is due to the effective gate voltage drop from self-biased negative feedback. At the drain region of the transistor, the drain region parasitic resistance does not appreciably affect drain current when the transistor is operating in the saturation region. Therefore, to achieve high-performance MOS transistor operation, it is known to form LDD structures only at the drain regions but not at the source regions.

One significant problem with the LDD structures is the formation of parasitic capacitors. These parasitic capacitors are formed due to the diffusion of dopants from the LDD towards the channel underneath the polysilicon gate as a result of RTA and other heating processes in the manufacturing of the transistors. These parasitic capacitors are highly undesirable because they slow down the switching speed of the transistors. The adverse speed impact increases disproportionately with shortened channels. Basically, the parasitic capacitance due to LDD structures as a percentage of the total transistor capacitance is higher for sub-0.18 micron transistors than it is for a 0.18-micron transistor and even worse for a sub-0.13 transistor, making the adverse speed impact much more significant in smaller transistors.

The conventional approaches to reduce parasitic capacitance have been to reduce LDD implant dosage or scaling down the operating voltage. However, these approaches also degrade the performance of the transistors.

Moreover, as the sub-0.13 micron transistors become smaller, interconnects to the transistors become more challenging. In making an interconnect to a polysilicon gate of a transistor, a layer of photoresist is coated over the semiconductor device. A radiation light source is used to transfer the patterns from a reticule onto the wafer. The radiation excites the photosensitive resins and subsequent processes remove the unwanted photoresist to form a pattern on top of the semiconductor device. A subtractive etch process then replicate the photoresist pattern to form pathways for the interconnect to the polysilicon gate. A typical deep ultraviolet source used as the radiation light source has a wavelength of 246 nanometers. As the polysilicon gate of semiconductors become smaller even with the more precise next generation 193 nanometers radiation source, it is still hard to control for accurate interconnects. Therefore, more advance techniques are required to provide accurate interconnects to the smaller transistors using existing radiation light sources.

Methods to minimize the formation of hot carriers by improving the gradual doping profile in LDD structures, to simplify the process for forming LDD structures by lessening the number of masking steps, and to reduce the parasitic capacitance due to LDD structures without compromising transistor performance have long been sought but have eluded those skilled in the art.

There have been prior art approaches to forming CMOS devices that yield similar polysilicon gate construction as those that will be described in the present invention. These prior art approaches provide a submerged polysilicon gate surrounded by a shallow trench isolation (STI). Disadvantages with the submerged polysilicon gate approach include additional processing steps, lengthy electrical paths, increased electromagnetic interference, and additional parasitic capacitance that arise from the polysilicon gate being submerged.

Accordingly, it is desirable to provide an apparatus and methods of operating the same that overcomes the disadvantages of the prior art.

DISCLOSURE OF THE INVENTION

The present invention provides an ultra-large scale CMOS integrated circuit semiconductor device which has an inverted trapezoidal gate with LDD structures having gradual doping profiles and salicided for contacts. The inverted trapezoidal gate structure results in reduced process complexity and is manufactured on a substrate having a barrier layer, forming a gate layer on the barrier layer, etching a closely width- and profile-controlled gate trench into the gate layer down to the substrate, depositing a gate oxide layer in the bottom of the gate trench, forming an inverted trapezoidal polysilicon gate, forming an in-situ spacer from the gate layer and the barrier oxide layer, implanting the substrate with a first dopant to form doped regions on both sides of the polysilicon gate, and saliciding the S/D region and the gate. This allows fewer processing steps for manufacturing the device.

The present invention provides an ultra-large scale CMOS integrated circuit semiconductor device which has a width- and profile-controlled, inverted trapezoidal gate with LDD structures having gradual doping profiles and salicided for contacts. The inverted trapezoidal gate structure results in reduced process complexity and is manufactured by forming a multi-layer structure of a barrier layer and a trench layer on a substrate, forming a trench isolation in the trench layer and barrier layer and substrate, removing the trench layer, forming a gate layer on the barrier layer, etching a gate trench into the gate layer down to the substrate, depositing a gate oxide layer in the bottom of the gate trench, forming an inverted trapezoidal polysilicon gate, forming an in-situ spacer from the gate layer and the barrier oxide layer, implanting the substrate with a first dopant to form doped regions on both sides of the polysilicon gate, and saliciding the S/D region and the gate. Thus, the semiconductor device has short electrical paths, decreased electromagnetic interference, and reduced parasitic capacitance.

The present invention further provides a method of manufacturing semiconductors having reduced parasitic capacitance.

The present invention further provides a method of manufacturing semiconductors having LDD structures in which process complexity is minimized by reducing the number of masking steps.

The present invention further provides a method of manufacturing semiconductors having LDD structures spaced away from the edge of polysilicon gates by providing polysilicon gates with reentrant sidewall profiles that shield the edge of the gate during ion implantations of the LDD structures.

The present invention further provides a method of manufacturing semiconductors having reduced cross sectional geometry at the base of polysilicon gates for reduced parasitic capacitance.

The present invention further provides a method of manufacturing semiconductors having large cross sectional geometry at the tops of polysilicon gates for reduced contact resistance.

The present invention further provides a method of manufacturing semiconductors by forming re-entrant polysilicon gates prior to formation of an in-situ spacer for shielding ion implantations.

The present invention further provides a method of manufacturing semiconductors having gate spacers and polysilicon gates with reentrant sidewall profiles that shield the underlying gate volumes from high energy, high concentration, ion implantations of S/D regions.

The present invention further provides a method of manufacturing semiconductors by eliminating the need for accurate measuring of critical dimensions at the base of the polysilicon gate.

The present invention further provides a method of manufacturing semiconductors with LDD structures having graded doping profiles which reduce hot carrier injections.

The present invention also provides a method of manufacturing semiconductors having larger polysilicon gate lengths at the top for reduced resistance.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
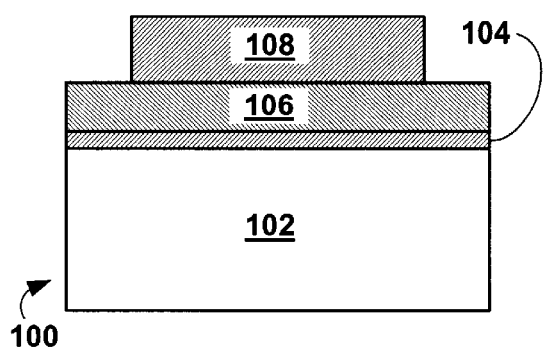
FIG. 1A illustrates a cross section of a semiconductor in an intermediate state of processing.

FIGS. 1A through 1V illustrate a reduced gate length process for fabricating CMOS transistors with lightly doped drain (LDD) structures in the source and drain (S/D) regions using an in-situ gate spacer. It should be noted that "source" and "drain" may be used interchangeably since they are the same for all purposes until connected in a circuit. It should also be noted that the term "region" used herein applies to areas after or subject to implantation since there is a tapering decrease or increase of atoms of a given dopant in the region designated rather than sharp demarcations as apparently indicated by the dotted lines shown in the FIGS.

Referring now to FIG 1A, therein is shown a cross section of a semiconductor 100 in an intermediate state of processing. At this stage are shown a semiconductor substrate 102, a barrier oxide layer 104, a nitride layer 106, and a photoresist trench mask 108. The barrier oxide layer 104 is grown/deposited over the semiconductor substrate 102 followed by the nitride layer 106. The photoresist trench mask 108 is patterned and developed to cover the nitride layer 106 except where a shallow trench isolation region (STI) is to be formed. The STI electronically isolates the final semiconductor device that is formed on the semiconductor 100.

Figure 1E:
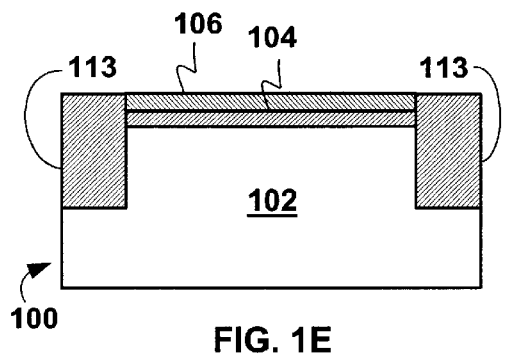
FIG. 1E illustrates the semiconductor after a trench oxide layer polish for the planarization of the trench oxide layer for the formation of shallow trench isolation (STI)
Figure 1B:
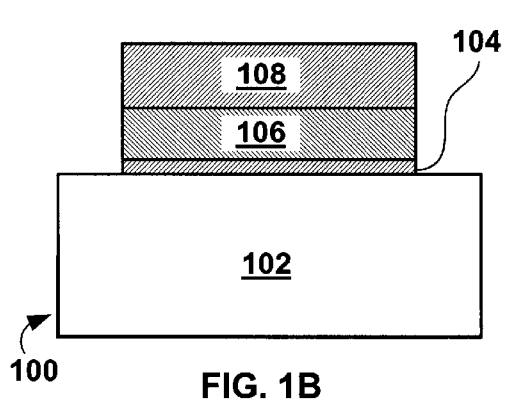
FIG. 1B illustrates a nitride layer and barrier oxide layer etch.

Referring now to FIG. 1B, therein is shown the semiconductor substrate 102 with the barrier oxide layer 104 and the nitride layer 106 etched in the pattern of the openings in the photoresist trench mask 108.

Figure 1F:
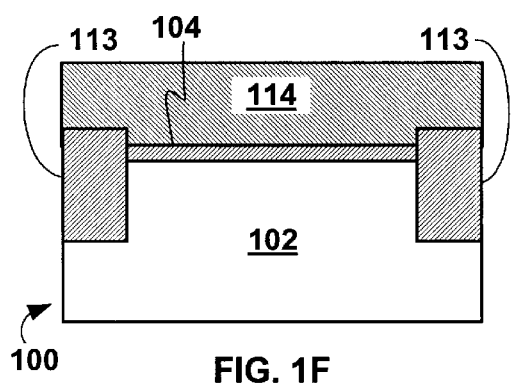
FIG. 1F illustrates the semiconductor after an addition of a gate nitride layer.
Figure 1C:
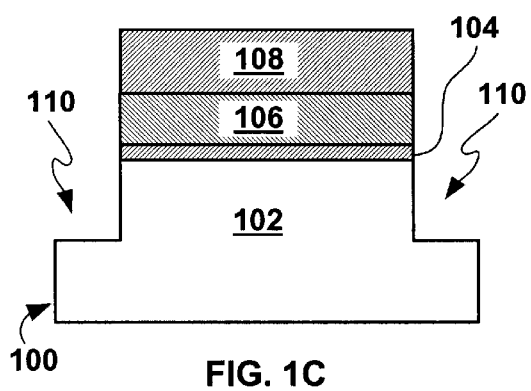
FIG. 1C illustrates a trench etch for the formation of a trench.

Referring now to FIG. 1C, therein is shown the semiconductor substrate 102 after the step of etching to form a trench 110. The trench 110 is formed using an anisotropic etch into the semiconductor substrate 102 using the nitride layer 106 and the barrier oxide layer 104 as masks.

Figure 2:
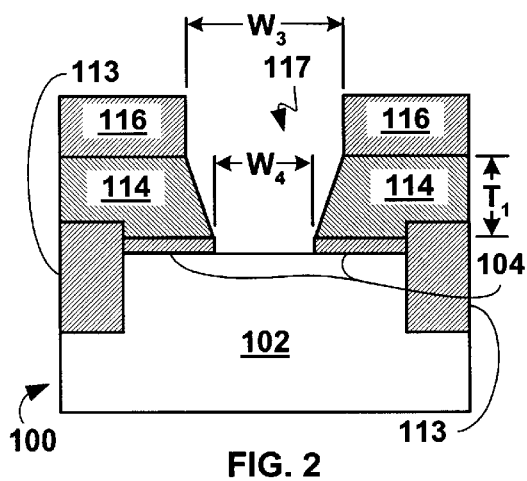
FIG. 2 illustrates one embodiment of the semiconductor with the second photoresist gate mask having a dimension "$W_3$" and the nitride layer having a thickness "$T_1$" for a plasma etch that creates a dimension "$W_4$" at the base of the gate nitride layer.
Figure 3:
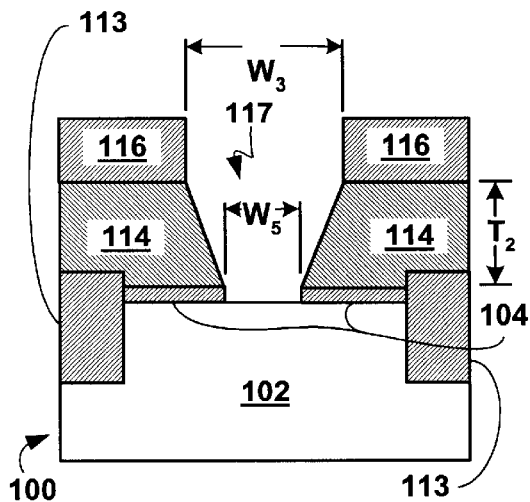
FIG. 3 illustrates another embodiment of the semiconductor with the second photoresist gate mask having a dimension "$W_3$" and tie nitride layer having a thickness "$T_2$" for a plasma etch that creates a dimension "$W_5$" at the base of the gate nitride layer.
Figure 4:
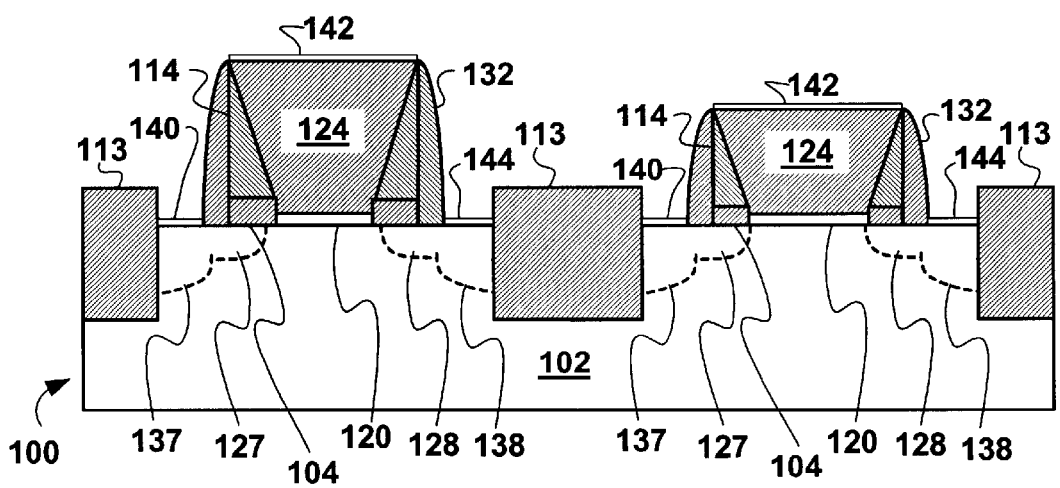
FIG. 4 illustrates the embodiments resulting from the embodiments of FIGS. 2 and 3 on a single substrate.

FIG. 4 illustrates the embodiments resulting from the embodiments of FIGS. 2 and 3 on a single substrate.

Figure 1G:
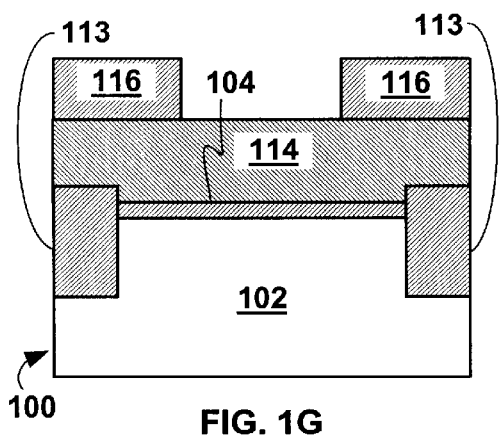
FIG. 1G illustrates the semiconductor after a second photoresist gate mask is formed over the gate nitride layer.
Figure 1D:
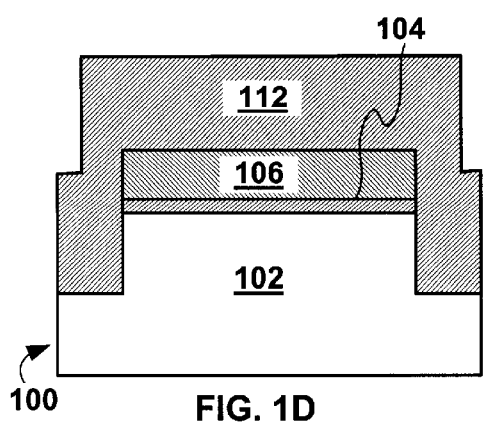
FIG. 1D illustrates trench oxide layer deposited over the entire surface of the semiconductor.

Referring now to FIG. 1D, therein is shown the semiconductor substrate 102 after the step of depositing a trench oxide layer 112 over the entire surface of the semiconductor 100 after removal of the photoresist trench mask 108.

Referring now to FIG. 1E, therein is shown a trench oxide layer polish for the removal of the trench oxide layer 112 for the formation of shallow trench isolation (STI) 113. An over-polish is used to remove a portion of the nitride layer 106 to insure the absence of the trench oxide layer 112 over the nitride layer 106.

Referring now to FIG. 1F, therein is shown the semiconductor substrate 102 after the addition of a gate nitride layer 114, which can be deposited thermally or using chemical vapor deposition (CVD). The gate nitride layer 114 is of the same material as the nitride layer 106 so the two blend together.

Referring now to FIG. 1G, therein is shown the semiconductor substrate 102 after a second photoresist gate mask 116 is formed over the gate nitride layer 114.

Figure 1H:
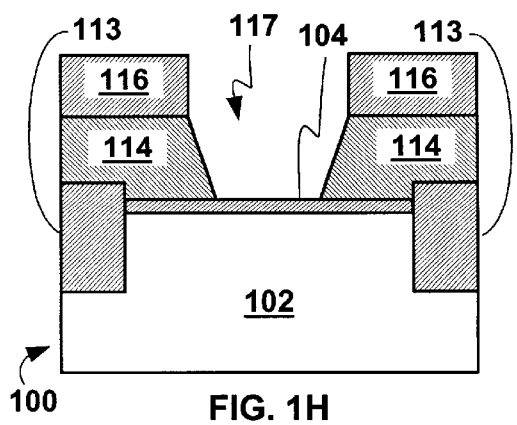
FIG. 1H illustrates the semiconductor after the unmasked portion of the gate nitride layer and the barrier oxide layer are etched.

Referring now to FIG. 1H, therein is shown the semiconductor substrate 102 after the unmasked portion of the gate nitride layer 114 is plasma etched to form a trench in the gate nitride layer 114 which defines an inverted trapezoidal gate trench 117 in preparation for polysilicon gate formation. A plasma etch of the gate nitride layer 114 characteristically has an inwardly sloped profile. The dimension at the bottom of the gate trench is less than the dimension at the opening of the second photoresist gate mask 116.

FIGS. 2 and 3 are discussed at this point because they relate to the step after FIG. 1H.

Referring now to FIG. 2, therein is shown the semiconductor substrate 102 with the second photoresist gate mask 116 having a dimension "$W_3$" and the gate nitride layer 114 having a thickness "$T_1$" after a plasma etch that creates a dimension "$W_4$" at the base of the gate nitride layer 114.

Referring now to FIG. 3, therein is shown the semiconductor substrate 102 with the second photoresist gate mask 116 having a dimension "$W_3$" and the gate nitride layer 114 having a thickness "$T_2$" after a plasma etch that creates a dimension "$W_5$" at the base of the gate nitride layer 114. Thickness "$T_2$" is greater than thickness "$T_1$". A plasma etch of the thickness "$T_2$" creates a dimension "$W_5$" that is smaller than "$W_4$". Accordingly, the thicker the gate nitride layer 114, the smaller the resulting width will be at the bottom of the trench.

Figure 1J:
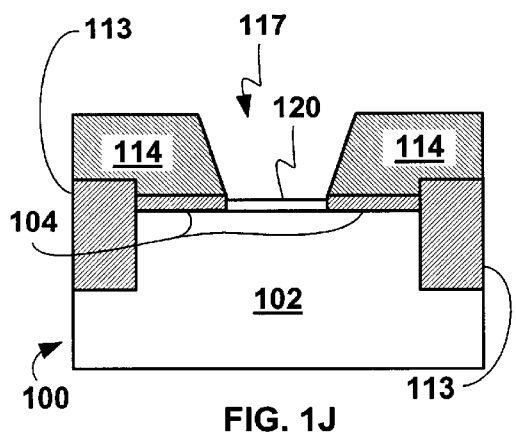
FIG. 1J illustrates the semiconductor after a gate oxide layer is grown over the exposed silicon region.
Figure 1K:
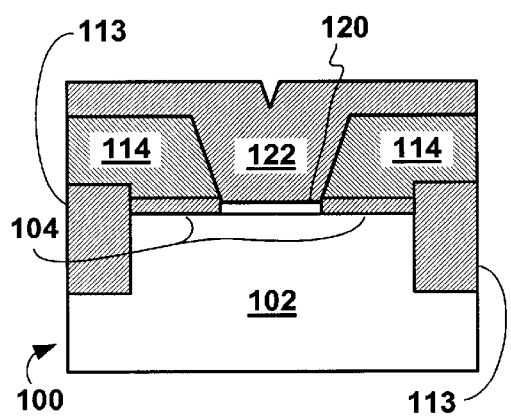
FIG. 1K illustrates the semiconductor after a polysilicon layer is deposited over the entire surface.
Figure 1I:
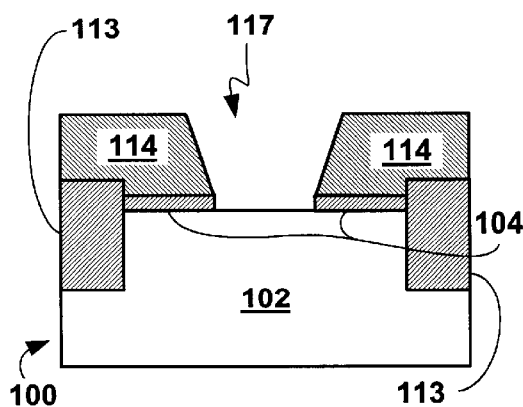
FIG. 1I illustrates the semiconductor after the second photoresist gate mask is removed.

Referring now to FIG. 1I, therein is shown the semiconductor substrate 102 after the second photoresist gate mask 116 is removed.

Referring now to FIG. 1J, therein is shown the semiconductor substrate 102 after a gate oxide layer 120 is grown over the exposed silicon region. The gate oxide layer 120 is very thin and it uses the silicon in the exposed silicon region of the substrate 102 for its formation; thus, it is not formed on top of the gate nitride layer 114.

Referring now to FIG. 1K, therein is shown the semiconductor substrate 102 after a polysilicon layer 122 is deposited over the entire surface.

Figure 1L:
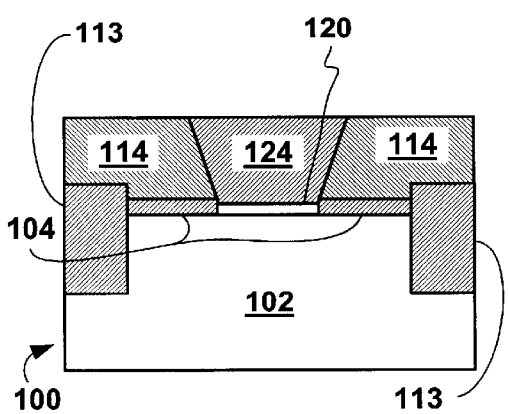
FIG. 1L illustrates the semiconductor after chemical-mechanical polishing (CMP) of the polysilicon layer to from a polysilicon gate.

Referring now to FIG. 1L, therein is shown the semiconductor substrate 102 after chemical-mechanical polishing (CMP) of the polysilicon layer 122 to from a polysilicon gate 124.

Figure 1M:
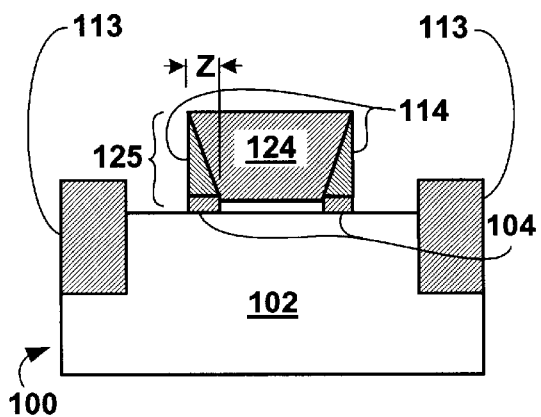
FIG. 1M illustrates the semiconductor after anisotropic selective etches are performed to remove the nitride layer and the barrier oxide layer.

Referring now to FIG. 1M, therein is shown the semiconductor substrate 102 after anisotropic selective etches are performed to remove the gate nitride layer 114 and the barrier oxide layer 104. The remaining gate nitride layer 114 and the barrier oxide layer 104 form an in-situ gate spacer 125 having a distance "Z" away from the edge of the gate oxide layer 120.

Figure 1P:
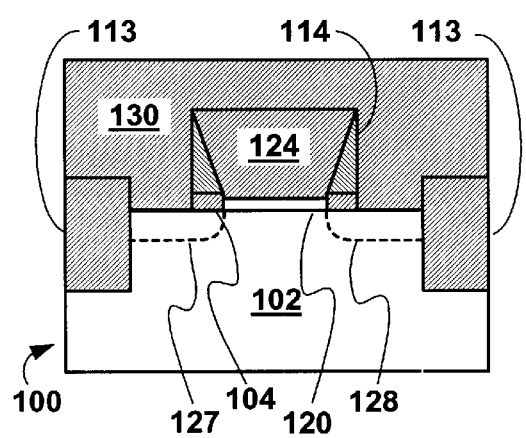
FIG. 1P illustrates the semiconductor after a secondary spacer layer is deposited using CVD over the entire surface.
Figure 1N:
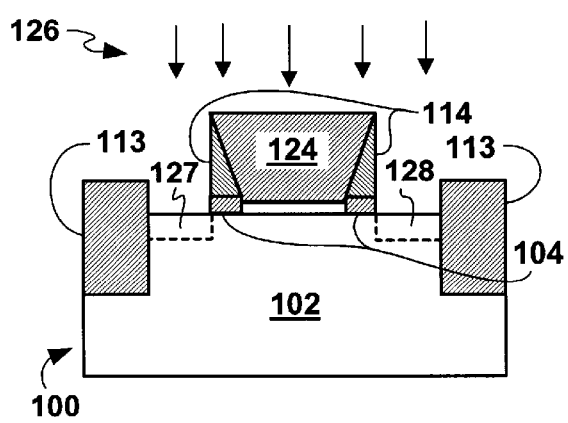
FIG. 1N illustrates the semiconductor after an ion implant of a P-type dopant on both sides of the gate oxide layer to form P-type doped, LDD regions or shallow S/D extension junctions.

Referring now to FIG. 1N, therein is shown the semiconductor substrate 102 after an ion implantation 126 of a P-type dopant on both sides of the gate oxide layer 120 to form P-type doped, LDD regions or shallow S/D extension junctions 127 and 128. In the best mode, a P-type dopant is used to form P-channel transistors although it would be evident to those skilled in the art that the present invention is equally applicable to forming N-channel transistors.

The upper portion of the polysilicon gate 124 and the in-situ gate spacer 125 provide a "mask" that shields the LDD implant from the bottom edge of the polysilicon gate 124. The distance between the S/D extension junctions 127 and 128 under the gate area is referred to as the "channel" and the length in the direction of the channel is referred to as the "gate length". It would be understood by those skilled in the art that, while disadvantageous for a number of reasons and difficult to perform, the implantation could be performed so as to have the S/D extension junctions 127 and 128 extending under the edge of the gate oxide layer 120. In the best mode, the implantation is performed to form the S/D extension junctions 127 and 128 to extend slightly short of the edge of the gate oxide layer 120.

Figure 1Q:
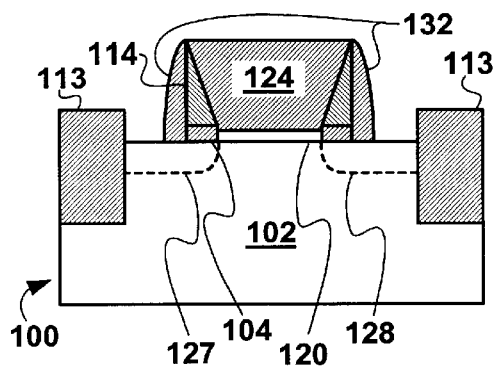
FIG. 1Q illustrates the semiconductor after anisotropically etching the secondary spacer layer to form a second gate spacer.
Figure 1O:
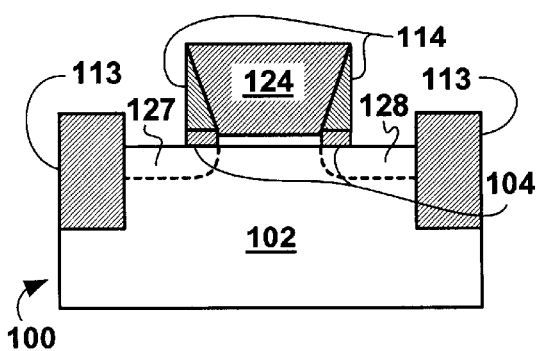
FIG. 1O illustrates the semiconductor after rapid thermal anneal (RTA) of the P-type doped, shallow S/D extension junctions.

Referring now to FIG. 1O, therein is shown the semiconductor substrate 102 after rapid thermal anneal (RTA) of the P-type doped, shallow S/D extension junctions 127 and 128. The transient enhanced diffusion (TED) caused by the RTA inherently increases the displacement of the P-type doped, shallow S/D extension junctions 127 and 128 into the channel just under the edge of the gate oxide layer 120.

Referring now to FIG. 1P, therein is shown the semiconductor substrate 102 after a secondary spacer layer 130 of oxide or nitride is deposited using CVD over the entire surface.

Referring now to FIG. 1Q, therein is shown the semiconductor substrate 102 after anisotropically etching the secondary spacer layer 130 to form a secondary gate spacer 132.

Figure 1R:
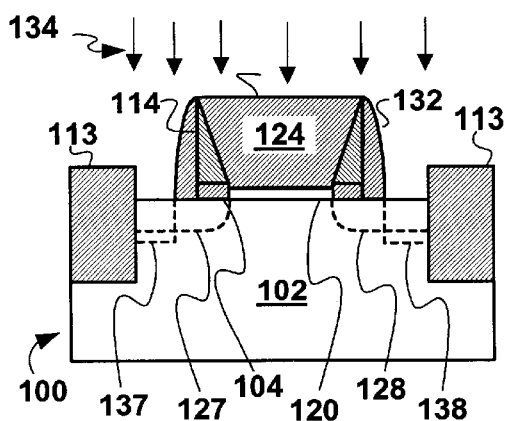
FIG. 1R illustrates the semiconductor after ion implantation of a P-type dopant around the polysilicon gate and the secondary spacer to form P-type doped, deep S/D junctions.

Referring now to FIG. 1R, therein is shown the semiconductor substrate 102 after ion implantation 134 of a P-type dopant around the polysilicon gate 124 and the secondary spacer 132 to form P-type doped, deep S/D junctions 137 and 138. The polysilicon gate 124 and the secondary spacer 136 shield the shallow S/D extension junctions 127 and 128 near the gate channel from the ion implantation 134.

Figure 1S:
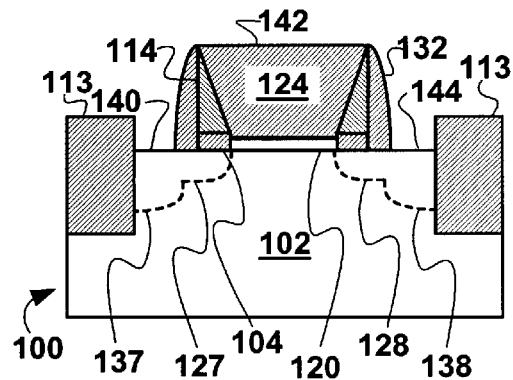
FIG. 1S illustrates the semiconductor after RTA of the P-type doped, shallow S/D extension junctions and the P-type doped, deep S/D junctions.

Referring now to FIG. 1S, therein is shown the semiconductor substrate 102 after RTA of the P-type doped, shallow S/D extension junctions 127 and 128 and the P-type doped, deep S/D junctions 137 and 138. The TED caused by the RTA inherently increases the displacement of the P-type doped, deep S/D extension junctions 137 and 138 into the channel. The P-type doped, shallow S/D extension junctions 127 and 128 provide resistance that suppresses hot electron formation. However, the overlap portion of the P-type doped, shallow S/D extension junctions 127 and 128 under the gate oxide layer 120 and the polysilicon gate 124 form parasitic capacitors. The more the overlap, the higher are the capacitances of the parasitic capacitors. As explained in the Background Art, parasitic capacitors are highly undesirable because they slow down the switching speed of the semiconductor devices. The adverse speed impact increases disproportionately with shortened channels. Thus, the polysilicon gate 124 having the in-situ gate spacer 125 and the secondary gate spacer 132 reduces the overlap portion of the underlying junctions.

Since the speed of charge and discharge across a gate channel is dependent on the available electrical channel length at the base of the polysilicon gate 124, the minimal cross-sectional geometry at the base of the inverted trapezoid provides a reduced base channel length that increases the speed of charge and discharge across the gate channel.

Figure 1T:
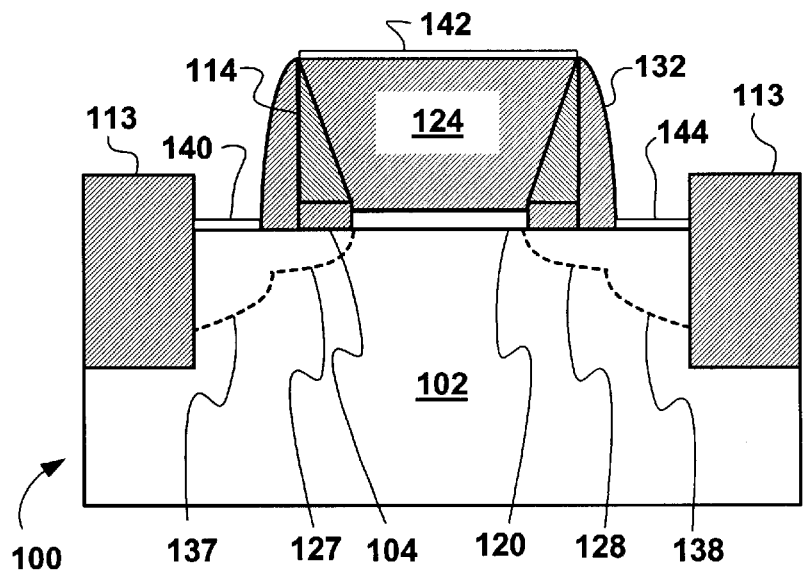
FIG. 1T illustrates the semiconductor after forming metallic salicides in the contact areas.

Referring now to FIG. 1T, therein is shown the semiconductor substrate 102 after forming metallic salicides 140, 142, and 144 in the contact areas where the doped regions and the polysilicon gate 124 are exposed. The saliciding process is performed in accordance with conventional techniques well known in the art.

In summary, FIGS. 1A through 1T illustrate an embodiment of the present invention for fabricating a semiconductor transistor with LDD structures in the S/D regions and with a re-entrant profile sidewall on the gate. The re-entrant profile sidewall provides larger gate area at the top which acts to reduce contact resistance while shielding LDD implant from the edge of the gate for improved gradual doping profiles that minimize hot carrier injections.

The shorter gate area at the base provides a shorter gate channel and reduced parasitic capacitances that afford higher operating speed for the semiconductor transistor.

In production of the first embodiment of the present invention, a conventional process is used to provide the semiconductor substrate 102 with the thin barrier oxide layer 104, the nitride layer 106, and the photoresist trench mask 108 formed thereon (FIG. 1A). The photoresist trench mask 108 defines an STI that is to be formed. An anisotropic etch forms the STI as defined by the photoresist trench mask 108. The trench oxide layer 112 is deposited over the entire surface after removal of the photoresist trench mask 108. A trench oxide layer polish is performed providing an over polish of the trench oxide layer 112 to remove a portion of the nitride 106 since the selectivity of nitride and oxide is high during the removal process which follows (FIG. 1E).

After removal of the exposed nitride layer 106, the gate nitride layer 114 is deposited using conventional thermal or CVD (FIG. 1F). The second photoresist mask 116 is conventionally formed with an opening defining the gate trench. An etch of the unmasked portion of the gate nitride layer 114 is performed and provides the inverted trapezoidal gate trench 117 (FIG. 1H).

The gate nitride layer 114 and the barrier oxide layer 104 have an established etch selectivity which enables precise etching of the gate trench 117. The plasma etch of the gate nitride layer 114 characteristically has an inwardly sloped profile. The dimension at the bottom of the trench is less than the dimension of the second photoresist gate mask 116. As the gate nitride layer 114 is etched, polymer by-products of the etch process form on the sidewall of the trench as it is etched down. The polymer by-products provide sidewall protection or passivation from the etch that causes the gate trench 117 have a smooth wall and non-ragged edges.

The polymer by-product formation also permits close tolerance, width-controlled, dimensions of the opening as the etch continues deeper into the gate nitride layer 114 and the barrier oxide layer 104. For a given plasma etch process, the thicker the gate nitride layer 114 and the barrier oxide layer 104, the smaller the widths $W_4$ and $W_3$ will be at the bottom of the trench (FIGS. 2 and 3). Moreover, the degree of the inwardly sloped profile is controllable by the amount of polymer forming gases, temperature, and bias which permits close tolerance profile-control of the in-situ gate spacer 125. Thus, by using a heuristic approach in testing different combinations of nitride layer thickness, forming gases, temperature, and bias, it is possible to optimize the electrical paths, electromagnetic interference, and parasitic capacitance for a production semiconductor device.

After removal of the second photoresist gate mask 116, the thin layer of thermal gate oxide layer 120 is grown over the exposed silicon region of the gate area. The gate oxide layer is thin and requires a silicon source for its formation. The gate oxide layer 120 is not formed on top of the gate nitride layer 114 (FIG. 1J). A polysilicon layer 122 is then deposited over the entire surface (FIG. 1K).

The excess polysilicon layer 122 is removed forming a polysilicon gate 124 using conventional CMP techniques stopping at the gate nitride layer 114 which serves as an endpoint for the polish (FIG. 1L).

The gate nitride layer 114 and the barrier oxide layer 104 are removed using conventional anisotropic selective etch (FIG. 1M). The remaining gate nitride layer 114 and the barrier oxide layer 104 form the in-situ gate spacer 125 having a profile determined distance "Z" away from the edge of the gate oxide layer 120.

The ion implantation 126 on both sides of the gate area forms P-type doped, shallow S/D extension junctions 127 and 128. It is a low energy, low concentration P-implant (FIG. 1P). The distance between the S/D extension junctions 127 and 128 under the gate area is referred to as the "channel" and the length in the direction of the channel is referred to as the "gate length". For ease of understanding, the mask for other polarity transistors is not shown. Those skilled in the art can readily apply the teachings to form other polarity transistors.

The inverted trapezoidal polysilicon gate 124 having the in-situ gate spacer 125 shield the underlying gate oxide layer 120 from the ion implantation 126 and influences the formation of the P-type doped, shallow S/D extension junctions 127 and 128 resulting in junctions with graded doping profiles. After RTA, the S/D extension junctions 127 and 128 extend just far enough under the edge of the gate oxide layer 120 to minimize parasitic capacitance (FIG. 1O). At the same time, the RTA causes the junction dopant concentrations at any point laterally along the shallow S/D extension junctions 127 and 128 to be inversely proportional to the distance underlying the gate area. The S/D extension junctions 127 and 128 have improved gradual doping profiles which minimize $E_m$. With $E_m$ minimized, hot electron injection is reduced.

A secondary gate spacer 132 is formed by depositing an oxide or nitride secondary spacer layer 130 using conventional CVD over the entire surface of the semiconductor 100 (FIG. 1P). The secondary gate spacer 132 provides control of the implantation of the P-type doped, deep S/D junctions 137 and 138. An anisotropic etch removes the excess secondary spacer layer 130 to form the secondary gate spacer 132 (FIG. 1Q).

Next, ion implantation 134 of a P-type dopant through the inverted trapezoidal polysilicon gate 124 and the secondary gate spacer 132 forms the P-type doped, deep S/D junctions 137 and 138. The ion implantation 134 is a high energy, high concentration P+ implant and the polysilicon gate 124 having the in-situ gate spacer 125 and secondary gate spacer 132 shield the shallow S/D extension junctions 127 and 128 from ion implantation damage (FIG. 1R). RTA of the P-type doped, deep S/D junctions 137 and 138 reduce the junction resistance of the shallow S/D extension junctions 127 and 128 (FIG. 1S).

The process concludes with formation of the metallic salicides 140, 142, and 144 on the deep S/D junctions 137 and 138 and the polysilicon gate 124 to provide conductive contact areas for direct connection of conventional contacts or vias to silicon or polysilicon (FIG. 1T). The metallic salicides 140 and 144 are approximately coplanar with the gate oxide layer 120.

For sake of ease of understanding, mask for other polarity transistor is not shown. Those skilled in the art can readily apply the teachings to form other polarity transistors.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A CMOS semiconductor comprising:
   a substrate;
   lint and second gate dielectrics on the substrate;
   first and second trapezoidal semiconductor gates respectively disposed on the first and second gate dielectrics; the first and second trapezoidal semiconductor gates respectively having thickness T1 and T2, first and second top widths, and bottom widths W3 and W4 where W3 and W4 are respectively smaller than the first and second top widths wherein:
      the first and second top widths are respectively directly proportional to T1 and T2 when W3 and W4 are equal dimensions,
      W3 and W4 are respectively inversely proportional to T1 and T2 when the first and second top widths are equal dimensions, and
      the first and second top widths are equal and W3 and W4 are equal when T1 and T2 are equal dimensions;
   gate spacers around the first and second trapezoidal semiconductor gates;
   source/drain junction regions in the substrate under the gate spacers and self-aligned with the gate dielectrics;
   contact areas on a source/drain junction regions adjacent to and coplanar with the gate spacers,
   secondary spacers adjacent the gate spacers; and
   deep source/drain junction regions in the substrate under the contact areas adjacent the secondary spacers and self-aligned with the secondary spacers.

2. The CMOS semiconductor as claimed in claim 1 including:
   the deep sources/drain junction regions in the substrate under the contact areas connected to the source/drain junction regions; and
   trench isolations disposed in the substrate around the deep source/drain junction regions.

3. The CMOS semiconductor as claimed in claim 1 wherein:
   the gate spacers include an oxide below a nitride.

4. A CMOS semiconductor comprising:
   a semiconductor substrate;
   first and second gate oxide layers on the semiconductor substrate;
   fist and second trapezoidal polysilicon gates disposed on the first and second gate oxide layers; the first and second trapezoidal polysilicon gates respectively having thickness T1 and T2, first and second top widths, and bottom widths W3 and W4 where W3 and W4 are respectively smaller than the first and second top widths wherein:
      the first and second top widths are respectively directly proportional to T1 and T2 when W3 and W4 are equal dimensions,
      the first and second top widths are respectively inversely proportional to T1 and T2 when the first and second top widths are equal dimensions, and
      The first and second top widths are equal and W3 and W4 are equal when T1 and T2 are equal dimensions;
   gate spacers around the first and second trapezoidal polysilicon gates;
   lightly doped source/drain extension junction regions in the semiconductor substrate under the spacer and self-aligned with the gate oxide layers;
   salicided contact areas above the doped source/drain extension junction adjacent and coplanar with the gate spacer;
   secondary spacers adjacent to the gate spacers; and
   heavily doped source/drain region regions in the substrate directly under and contacting the salicided contact area adjacent the secondary spacer and self-aligned with the secondary spacers.

5. The CMOS semiconductor as claimed in claim 4 including:
   trench isolations disposed in the substrate around the lightly doped source/drain junction regions.

6. The CMOS semiconductor as claimed in claim 5 wherein:
   the gate spacers include an oxide below a nitride; and
   the trench isolations are an oxide.

* * * * *

UNITED STATES PATENT AND TRADEMARK OFFICE
CERTIFICATE OF CORRECTION

PATENT NO.      : 6,433,371 B1
DATED           : August 13, 2002
INVENTOR(S)     : Scholer et al.

It is certified that error appears in the above-identified patent and that said Letters Patent is hereby corrected as shown below:

Column 6,
Line 60, section BEST MODE FOR CARRYING OUT THE INVENTION, delete the paragraph, "Fig. 4 illustrates the embodiments resulting from the embodiments of FIGS 2 and 3 on a single substrate."

Column 9,
Line 7, section BEST MODE FOR CARRYING OUT THE INVENTION, insert the paragraph therefor -- Fig. 4 illustrates the embodiments resulting from the embodiments of FIGS 2 and 3 on single substrate. --

Column 11,
Line 13, delete "lint" and insert therefor -- first --.
Line 35, delete "spacers," and insert therefor -- spacers; --.
Line 42, delete "sources/drain" and insert therefor -- source/drain --.

Column 12,
Line 8, delete "fist" and insert therefor -- first --.
Line 22, delete "The" and insert therefor -- the --.

Signed and Sealed this

Fourteenth Day of January, 2003

JAMES E. ROGAN
*Director of the United States Patent and Trademark Office*